United States Patent
Cheng et al.

(10) Patent No.: US 7,550,795 B2
(45) Date of Patent: Jun. 23, 2009

(54) SOI DEVICES AND METHODS FOR FABRICATING THE SAME

(75) Inventors: Chung-Long Cheng, Hsinchu (TW); Kong-Beng Thei, Hsinchu (TW); Sheng-Chen Chung, Hsinchu (TW); Tzung-Chi Lee, Hsinchu (TW); Harry Chuang, Austin, TX (US)

(73) Assignee: Taiwan Semiconductor Manufacturing, Hsin-Chu (TW)

( * ) Notice: Subject to any disclaimer, the term of this patent is extended or adjusted under 35 U.S.C. 154(b) by 222 days.

(21) Appl. No.: 11/477,953

(22) Filed: Jun. 30, 2006

(65) Prior Publication Data

US 2008/0001188 A1    Jan. 3, 2008

(51) Int. Cl.
*H01L 29/76* (2006.01)

(52) U.S. Cl. .................... 257/288; 257/347; 257/350; 257/E29.261

(58) Field of Classification Search .............. 257/288, 257/347, 350, E29.261, E29.265
See application file for complete search history.

(56) References Cited

U.S. PATENT DOCUMENTS

| | | | |
|---|---|---|---|
| 6,465,823 B1 * | 10/2002 | Yagishita et al. | 257/288 |
| 6,468,887 B2 * | 10/2002 | Iwasa et al. | 438/585 |
| 6,969,676 B2 * | 11/2005 | Schwan et al. | 438/637 |
| 2003/0105039 A1 | 6/2003 | Zarling et al. | |
| 2003/0143864 A1 | 7/2003 | Tanabe et al. | |
| 2003/0222308 A1 | 12/2003 | Su et al. | |
| 2005/0189610 A1 * | 9/2005 | Usuda et al. | 257/510 |
| 2006/0038242 A1 * | 2/2006 | Hsu et al. | 257/407 |
| 2007/0108525 A1 * | 5/2007 | Yang et al. | 257/351 |

* cited by examiner

Primary Examiner—Tuan N. Quach
(74) Attorney, Agent, or Firm—Birch, Stewart, Kolasch & Birch, LLP

(57) ABSTRACT

Silicon on insulator (SOI) devices and methods for fabricating the same are provided. An exemplary embodiment of a SOI device comprises a substrate. A first insulating layer is formed over the substrate. A plurality of semiconductor islands is formed over the first insulating layer, wherein the semiconductor islands are isolated from each other. A second insulating layer is formed over the first insulating layer, protruding over the semiconductor islands and surrounding thereof. At least one recess is formed in a portion of the second insulating layer adjacent to a pair of the semiconductor islands. A first dielectric layer is formed on a portion of each of the semiconductor islands. A conductive layer is formed over the first dielectric layer and over the second insulating layer exposed by the recess. A pair of source/drain regions is oppositely formed in portions of each of the semiconductor islands not covered by the first dielectric layer and the conductive layer.

9 Claims, 9 Drawing Sheets

SOI DEVICES AND METHODS FOR FABRICATING THE SAME

BACKGROUND OF THE INVENTION

1. Field of the Invention

The present invention relates to semiconductor fabrication, and in particular to silicon-on-insulator (SOI) device fabrication.

2. Description of the Related Art

Silicon-on-insulator (SOI) technology has become an increasingly important technique utilized in the fabrication and production of semiconductor devices. SOI technology deals with the formation of transistors in a relatively thin monocrystalline semiconductor layer, which overlays an insulating layer. The insulating layer is typically formed on an underlying substrate, which may be silicon. In other words, the active devices are formed in a thin semiconductor on insulator layer rather than in the bulk semiconductor of the device. Currently, silicon is most often used for this monocrystalline semiconductor layer in which devices are formed. However, it will be understood by those skilled in the art that other monocrystalline layers such as germanium or gallium arsenide may be used. Accordingly, any subsequent reference to silicon will be understood to include any semiconductor material.

High performance and high-density integrated circuits are achievable by using the SOI technology because of the reduction of parasitic elements present in integrated circuits formed in bulk semiconductors. Since SOI structures significantly alleviate parasitic elements, and increase the junction breakdown tolerance of the structure, the SOI technology is well suited for high performance and high-density integrated circuits. SOI technology also exhibits its advantages for higher speed, lower power consumption and better radiation immunity due to the enhanced isolation of buried oxide layers.

FIGS. 1-2 partially illustrate a related art SOI device 10. As shown in FIG. 1, a schematic top view of a part of the SOI device 10 is illustrated. The SOI device 10 includes a plurality of transistors 104, 106, 108 and 110 formed thereon, isolated from each other by an insulating layer 102. In addition, two word lines 112 and 114 are provided over the insulating layer 102, respectively crossing over a pair of the SOI transistors. Source/drain regions S/D are formed on opposing sides of the word lines 112 and 114 in each of the SOI transistors 104, 106, 110 and 112. The word line 112 protrudes over the insulating layer 102 and overlies the transistors 104, 106 and a portion of the insulating layer 102 between and adjacent thereto, and the word line 114 protrudes over the insulating layer 102 and overlies the transistors 108, 110 and a portion of the insulating layer 102 between and adjacent thereto. As shown in FIG. 1, the transistors 104, 106, 108 and 110 can be, for example, N-type or P type MOS transistors for defining two MOS transistor arrays in regions 116 and 118 over the SOI device 10, which are shown as dotted lines in FIG. 1, respectively. The MOS array in regions 116 and 118 can function as a PMOS array, an NMOS array or a CMOS array and depends on actual circuit design of the SOI device 10.

FIG. 2 illustrates a cross section taken along line 2-2 of FIG. 1. As shown in FIG. 2, the SOI transistors 104, 106, 108, 110 are respectively formed of a gate dielectric layer 206 stacked on a silicon island 204. The silicon islands 204 are formed on an insulating layer 202 over a base substrate 200, for example a silicon substrate. The silicon islands 204 are electrically isolated from each other by the insulating layer 102 surrounding thereto. Typically, the insulating layer 102 protrudes over the top surface of the silicon island and a recess R is defined over each of the transistors. Referring to the FIG. 2, the word lines 112 and 114 respectively overlie the gate dielectric layer 206 of a pair transistors of the SOI transistors 104, 106, 108 and 110, filling each of the recesses R therein and protruding over the surface between and adjacent to the transistors. With the trend toward size reduction of transistors such as the transistors 104, 106, 108 and 110, a finer spacing is required between the regions 116 and 118. As shown in FIG. 2, since the word lines 112 and 114 protrude over the insulating layer 102, reducing a spacing d1 between the adjacent transistors formed in the regions 116 and 118 is problematic in view of shorting issues which may be caused by the portion of the wordlines 112 and 114, thus size reduction of an SOI device formed over the SOI device 10 and increase of device density thereon is inhibited.

Based on the foregoing, the inventors have thus concluded that a need exists for a silicon-on-insulator (SOI) device capable of eliminating the described line shorting issue of the related art SOI devices. Additionally, the inventors have concluded that this problem can be solved with an improved SOI device and associated fabrication methods, which are disclosed herein, which additionally leads to improvements in process and reliability for such a device.

BRIEF SUMMARY OF THE INVENTION

Silicon on insulator (SOI) devices and methods for fabricating the same are provided. An exemplary embodiment of an SOI device comprises a substrate. A first insulating layer is formed over the substrate. A plurality of semiconductor islands is formed over the first insulating layer, wherein the semiconductor islands are isolated from each other. A second insulating layer is formed over the first insulating layer, protruding over and surrounding the semiconductor islands. At least one recess is formed in a portion of the second insulating layer adjacent to a pair of the semiconductor islands. A first dielectric layer is formed on a portion of each of the semiconductor islands. A conductive layer is formed over the first dielectric layer and over the second insulating layer exposed by the recess. A pair of source/drain regions is oppositely formed in portions of each of the semiconductor islands not covered by the first dielectric layer and the conductive layer.

Another embodiment of a transistor comprises a first insulating layer. A semiconductor island is formed over a portion of the first insulating layer. A gate dielectric layer is formed over a portion of the semiconductor island. A gate electrode is formed over the gate dielectric layer. A pair of source/drain regions is formed in portions of the semiconductor island opposing the gate electrode. A second insulating layer is formed over the first insulating layer, surrounding the gate electrode and having a top surface substantially coplanar with that of the gate electrode.

An exemplary embodiment of a method for fabricating a silicon on insulator (SOI) device comprises providing a substrate with a first insulating layer thereon. A plurality of semiconductor islands are formed over the first insulating layer, wherein the semiconductor islands are isolated from each other. A second insulating layer is formed over the first insulating layer, protruding over and surrounding the semiconductor islands. At least one recess is formed in a portion of the second insulating layer adjacent to a pair of the semiconductor islands. A first dielectric layer is formed on a portion of each of the semiconductor islands. A conductive layer is formed over the first dielectric layer and the second insulating layer exposed by the recess. A pair of source/drain regions are oppositely formed in portions of each of the semiconductor islands not covered by the first dielectric layer and the conductive layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 3-6 are schematic diagrams illustrating fabrication steps of an SOI device according to an exemplary embodiment of the invention, wherein each of the FIGS. 3-6 includes three schematic diagrams with subtitles a-c, which are taken along from different visual angles for the purpose of better illustration, and are generally referred to here as FIGS. 3-6.

Figure 1:
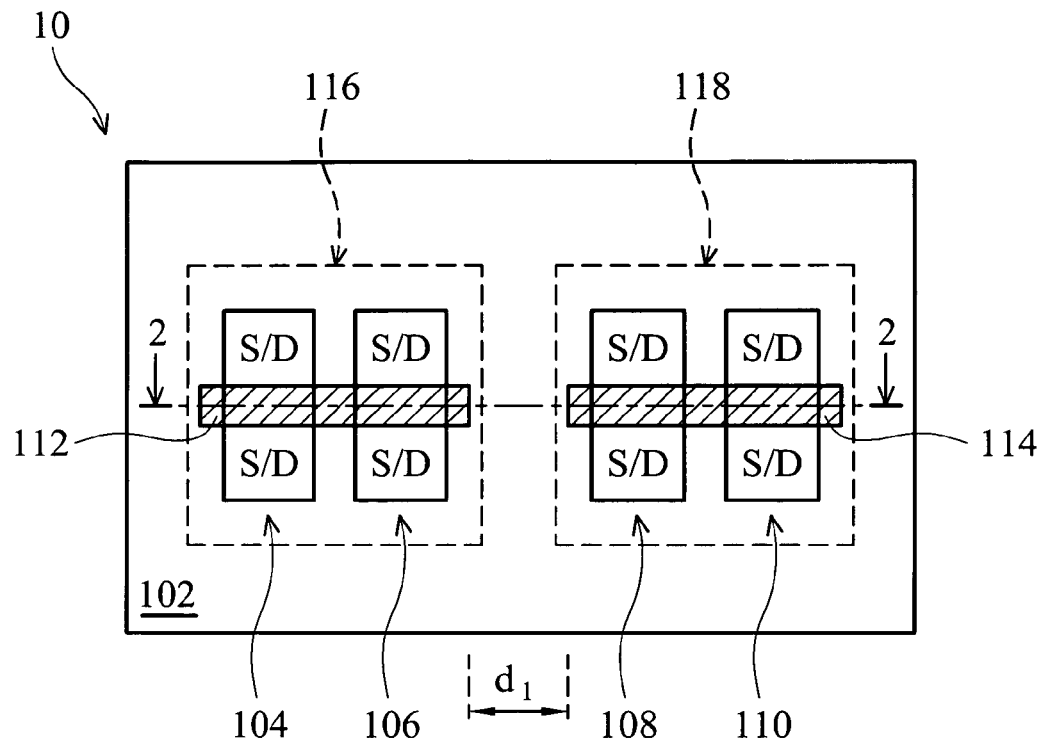
FIG. 1 is a schematic top view of a prior art SOI device.
Figure 2:
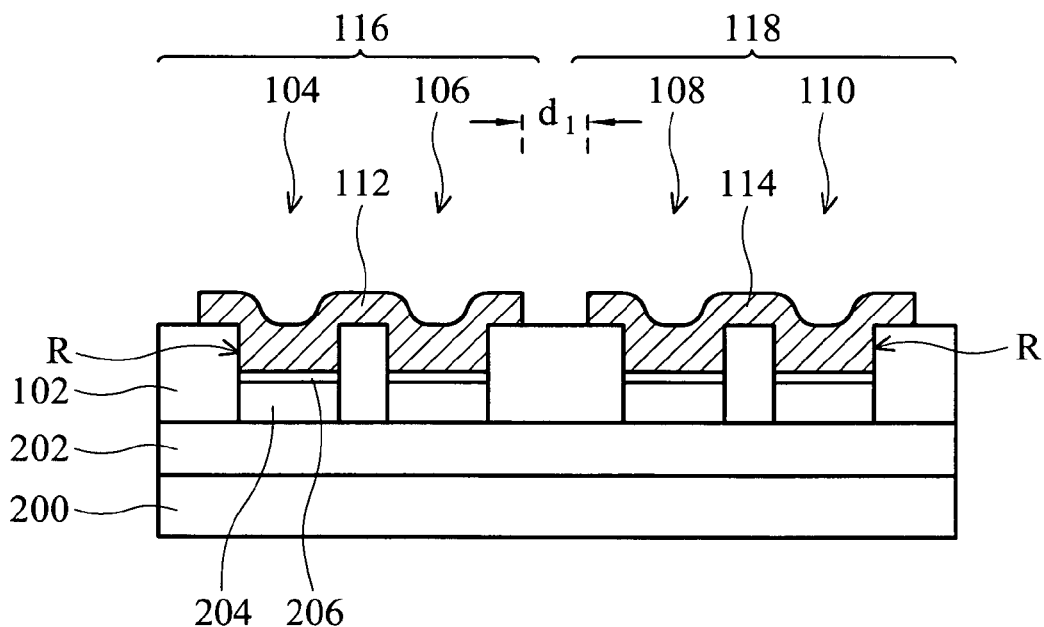
FIG. 2 is a cross section of a part of the related art SOI device in FIG. 1, taken along line 2-2 therein.
Figure 3A:
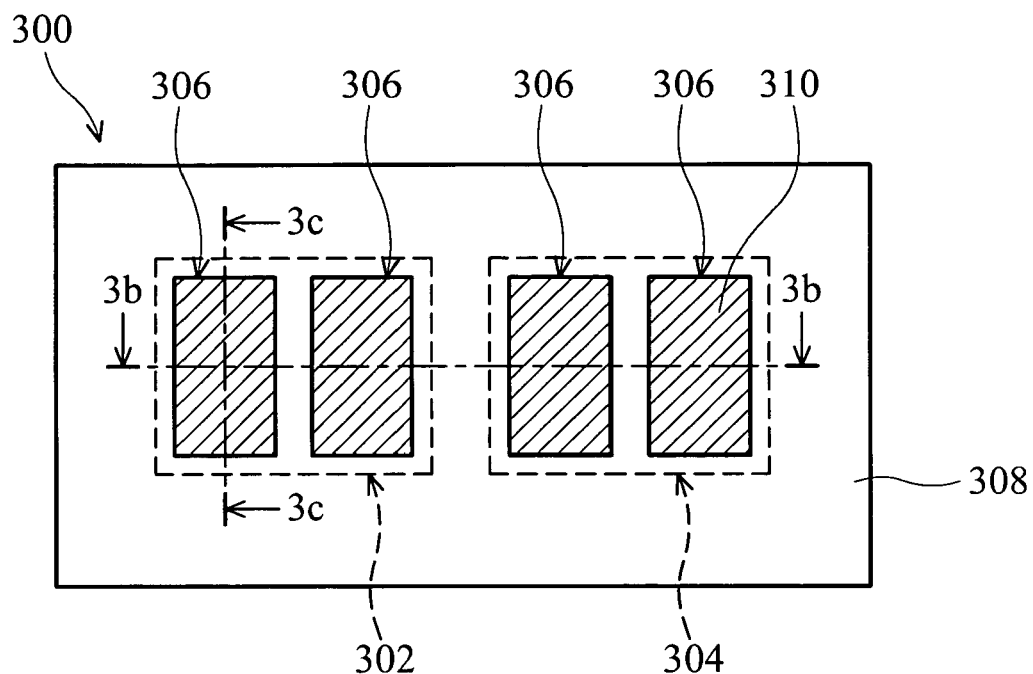
FIGS. 3a, 4a, 5a and 6a are schematic diagrams showing steps for fabricating an silicon on insulator (SOI) device according to an embodiment of the invention.
Figure 3B:
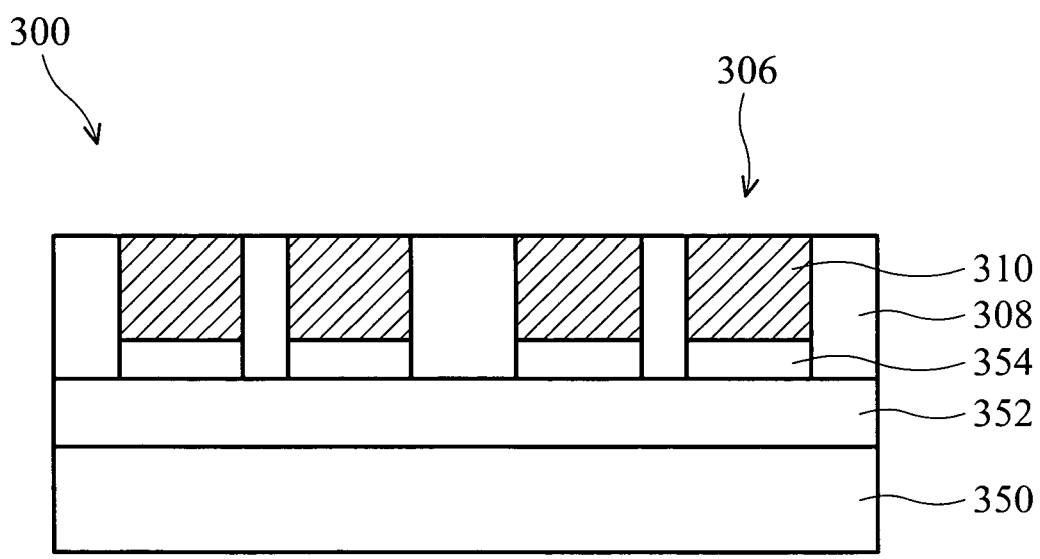
FIGS. 3b, 4b, 5b and 6b are schematic diagrams showing cross section taken along line 3b-3b, 4b-4b, 5b-5b and 6b-6b in FIGS. 3b, 4b, 5b and 6b, respectively.
Figure 3C:
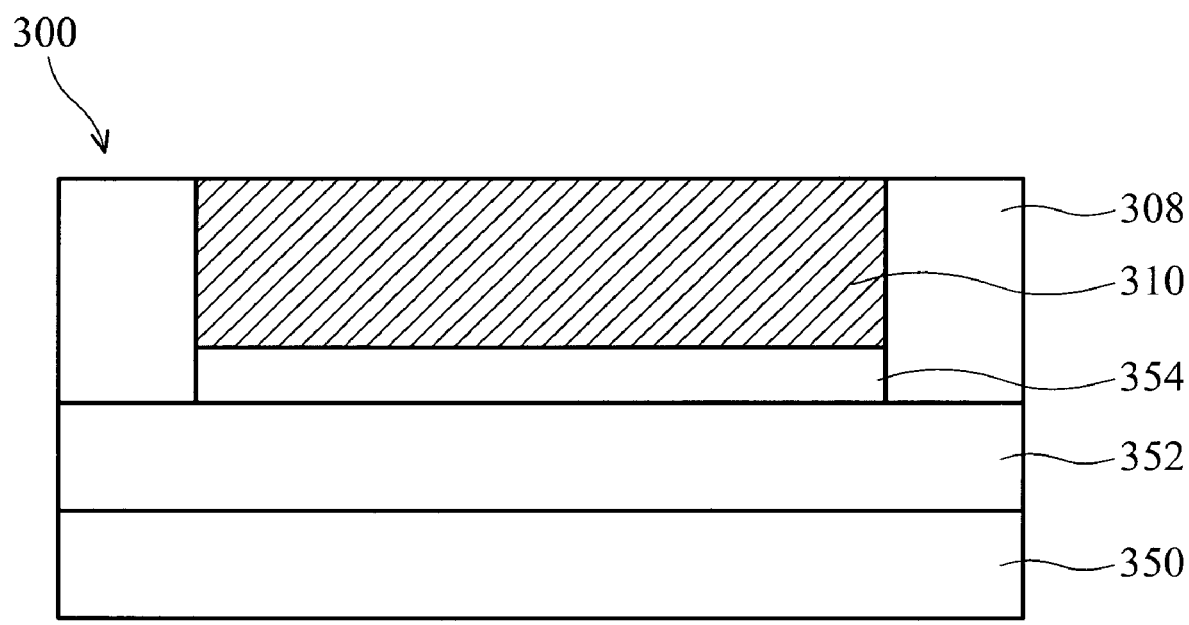
FIGS. 3c, 4c, 5c and 6c are schematic diagrams showing cross section taken along line 3c-3c, 4c-4c, 5c-5c and 6c-6c in FIGS. 3c, 4c, 5c and 6c, respectively

Referring now to the FIG. 3, a partially fabricated SOI device 300 is first provided. FIG. 3a illustrates a top view of a part of the SOI device 300, including a pair of device regions 302 and 304 defined thereon, each comprising a pair of device patterns 306. As shown in FIG. 3a, the SOI device 300 is covered with a blanket insulating layer 308, isolating the device patterns 306 from each other and exposed via a mask layer 310 thereon, respectively. In addition, FIGS. 3b and 3c illustrate cross sections taken along line 3b-3b and line 3c-3c of FIG. 3a, respectively. As shown in FIGS. 3b and 3c, the device patterns 306 and the surrounding insulating layer 308 are substantially coplanar and the SOI device 300 is now formed with a planar surface. The SOI device 300 mainly includes a base substrate 350, such as a silicon substrate, and an insulating layer 352 formed thereon. The SOI device 300 further comprises a semiconductor island 354 covered with a mask layer 310 thereon over portions of the insulating layer 352, functioning as device patterns 306. Formation of device patterns 306 are described in the following. The insulating layer 352 is first provided with a layer of semiconductor material and a layer of masking material (not shown) thereon. The layer of mask material is then patterned to form the patterned mask layers 310, thereby exposing portions of the semiconductor material. The semiconductor material exposed by the mask layers 310 is then removed in an etching step (not shown), thereby defining a plurality of isolated semiconductor islands 354 on the insulating-layer 352, using the patterned mask layer 310 as an etching mask. The semiconductor islands 354 may comprise semiconductor materials such as silicon, silicon germanium (SiGe), or similar. The mask layer 310 may be a single film or a composite film, comprising silicon oxide, silicon nitride, silicon oxynitride, or combinations thereof. Next, an insulating material such as silicon oxide is blanketly formed over the SOI device, filling the spacing between the isolated semiconductor islands 354 and covering the mask layer 310. The insulating material over the mask layer 310 is then planarized by a method such as chemical mechanical polishing (CMP), thereby leaving the insulating layer 308 formed between the semiconductor islands 354. As shown in FIGS. 3b and 3c, the SOI device 300 in FIG. 3 now has a substantially planar surface.

Figure 4A:
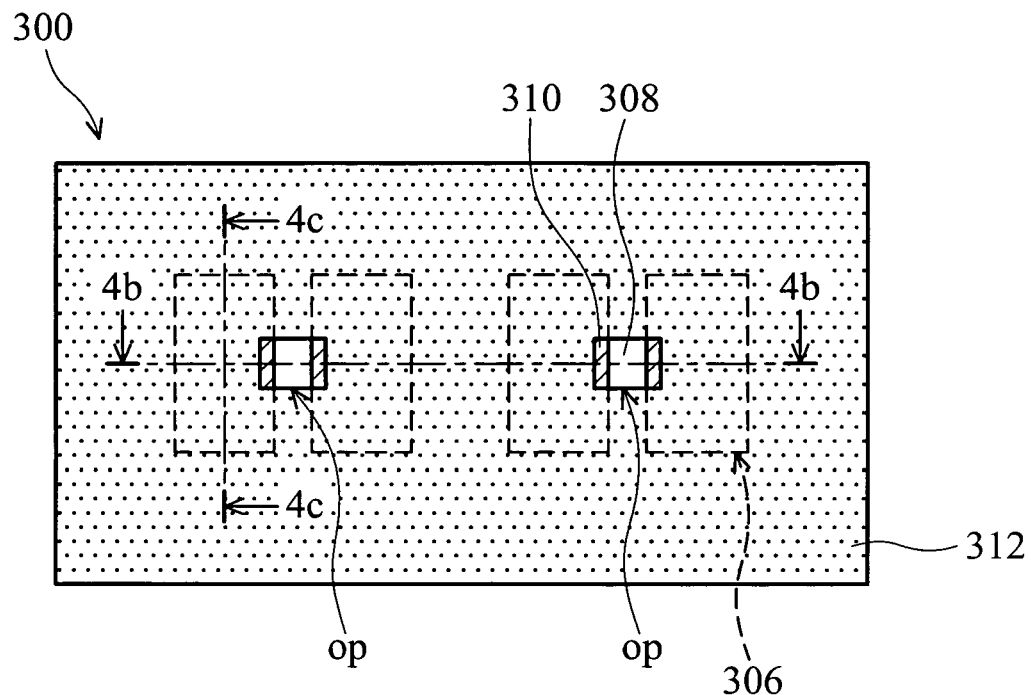
Figure 4B:
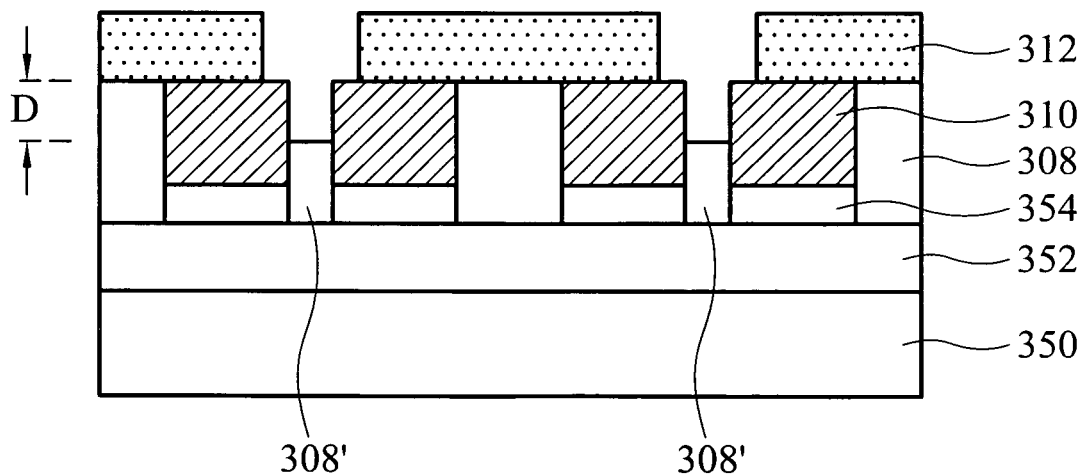
Figure 4C:
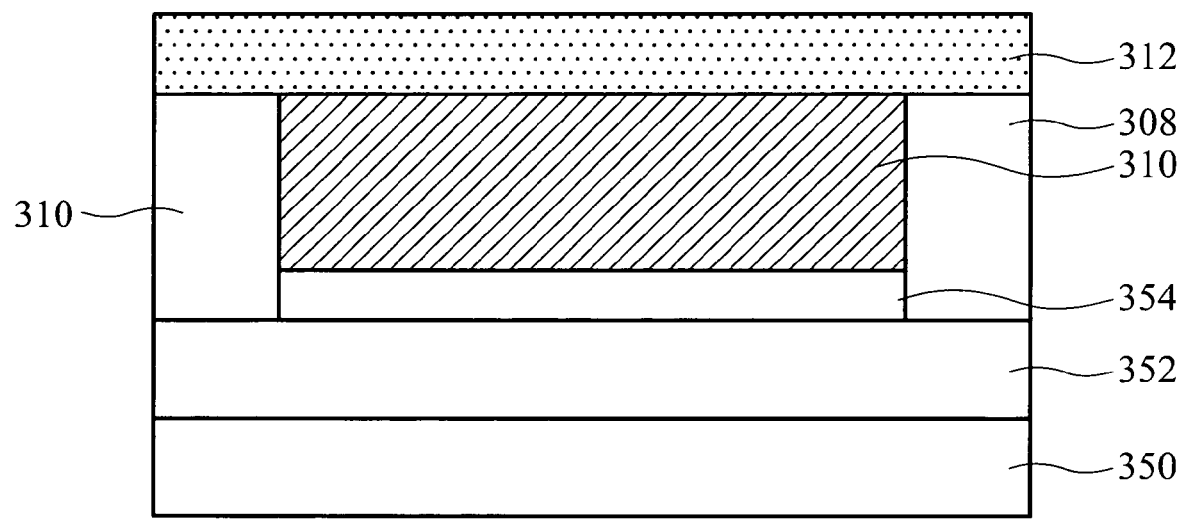

Referring now to the FIG. 4, another mask layer 312 is then formed over the SOI device 300, blanketly covering the insulating layer 308. The mask layer 312 is next patterned to form an opening OP in each of the device regions 302 and 304 (not shown in FIG. 4). FIG. 4a illustrates a top view of a part of the SOI device 300 formed with the mask layer 312, having openings OP therein. As shown in FIG. 4A, each of the openings OP locates at a place substantially between each pair of the device patterns 306, thereby exposing portions of the mask layer 310 and the insulating layer 308. The mask layer 312 may comprise resist material and the openings OP can thereby be formed by methods such as photolithography or similar. Next, an etching step (not shown) such as a wet etching step or a dry etching step is performed to each the insulating layer 308 exposed by the openings OP, using the mask layers 312 and the mask layer 310 exposed by the opening OP, and thereby forms the portions of the insulating layer 308 exposed by the opening OP to a depth D of about 200~3000 Å below the top surface of the mask layer 310, thereby forming a recessed insulating layer 308' between the pair of semiconductor islands 354. FIGS. 4b and 4c illustrate cross sections taken along line 4b-4b and line 4c-4c of FIG. 4a, respectively illustrating the recessed insulating layer 308' formed with a recessed depth D from different viewing angles.

Figure 5A:
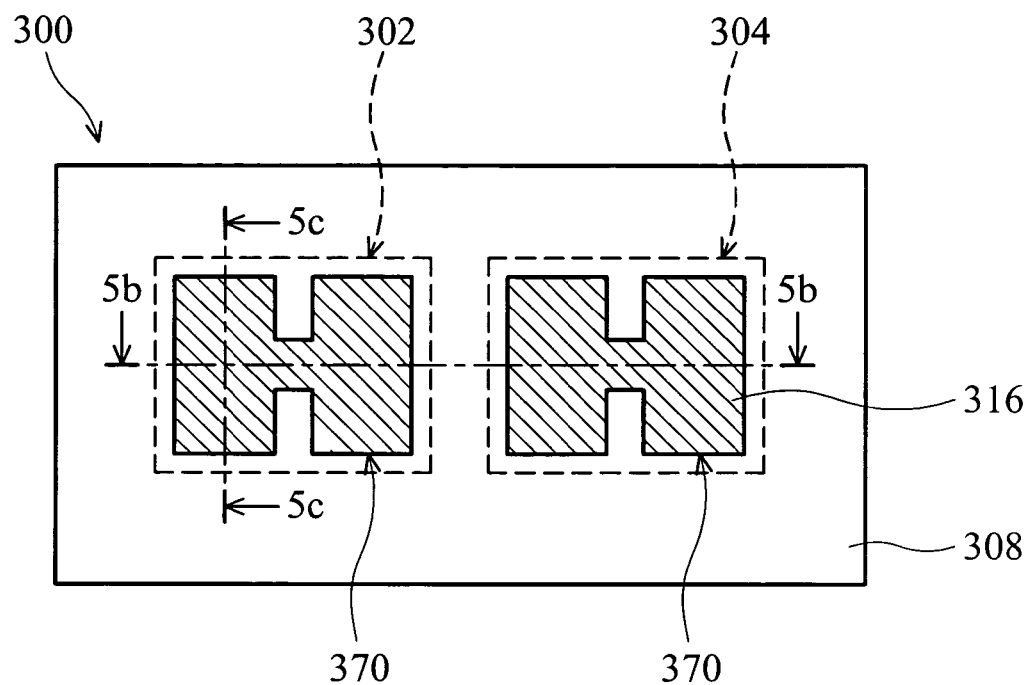
Figure 5B:
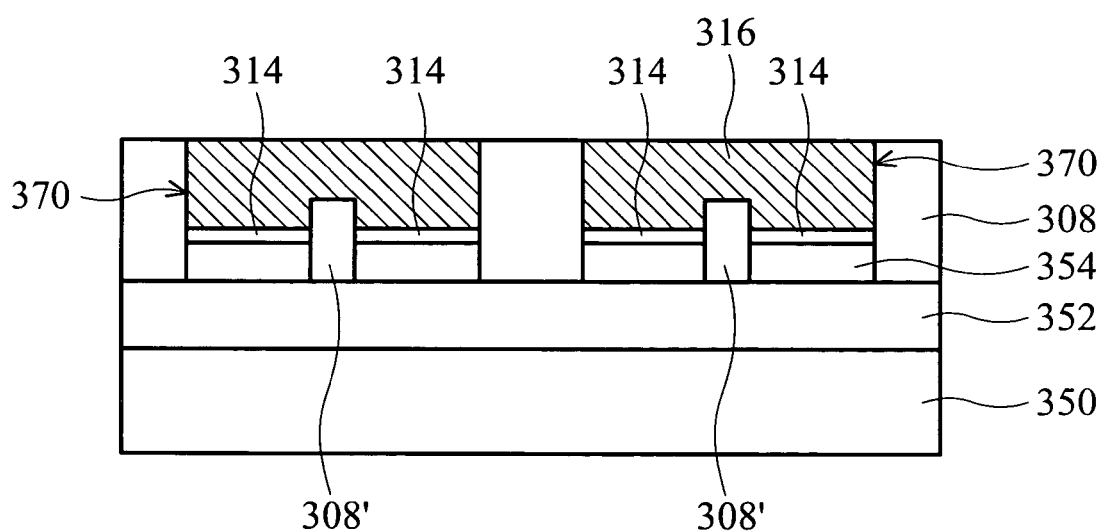
Figure 5C:
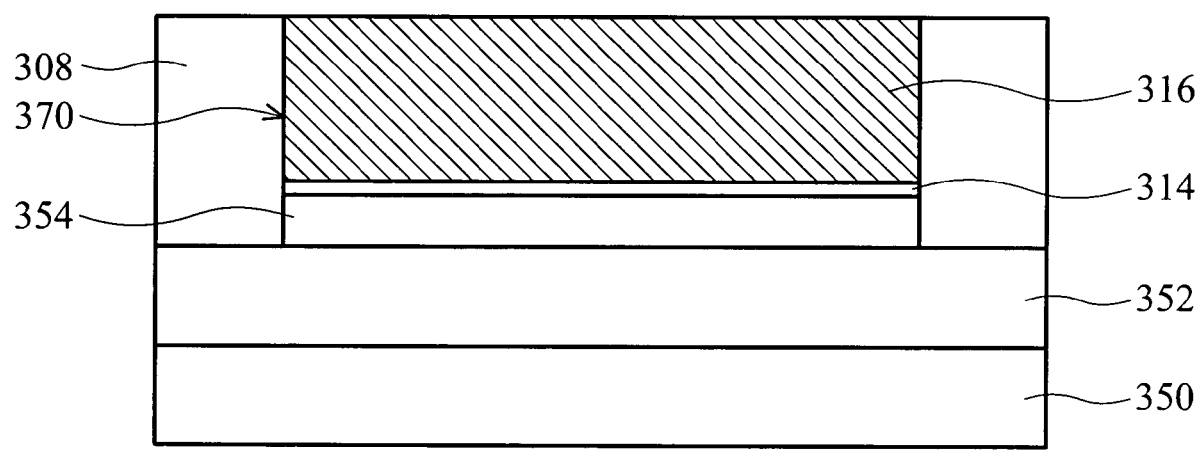

Referring now to the FIG. 5, the mask layers 312 and 310 in FIG. 4 are next removed to thereby form an opening 370 (see FIG. 5a), having an H-like shape from the top view, in each of the device regions 302 and 304. Each of the openings 370 exposes a pair of semiconductor islands 354 and the recessed insulating layer 308' formed therebetween. Next, a dielectric layer 314 is formed on each of the semiconductor islands 354 by methods such as thermal oxidation, chemical vapor deposition (CVD) or similar. The dielectric layer 314 may comprise materials such as silicon oxide, silicon nitride, silicon oxynitride, or combinations thereof. The dielectric layer 314 may also comprises high-k dielectric materials of greater dielectric constant (typically greater than 3.0) such as hafnium dioxide (HfO2), zirconium dioxide (ZrO2), titanium dioxide (TiO2), or the like. Next, a conductive material is blanketly formed over the SOI device 300, filling the openings 370 and covering the insulating layer 308. The conductive material is then planarized by methods such as chemical mechanical polishing (CMP) to remove the portions thereof over the top surface of the insulating layer 308. Therefore, a conductive layer 316 is formed in each of the openings 370 and is isolated by the surrounding insulating layer 308. FIGS. 5b and 5c illustrate cross sections taken along line 5b-5b and line 5c-5c of FIG. 5a from different viewing angles, respectively. The conductive material of the conductive layer 316 can be, for example, dopant doped polysilicon or metal materials such as tungsten.

Figure 6A:
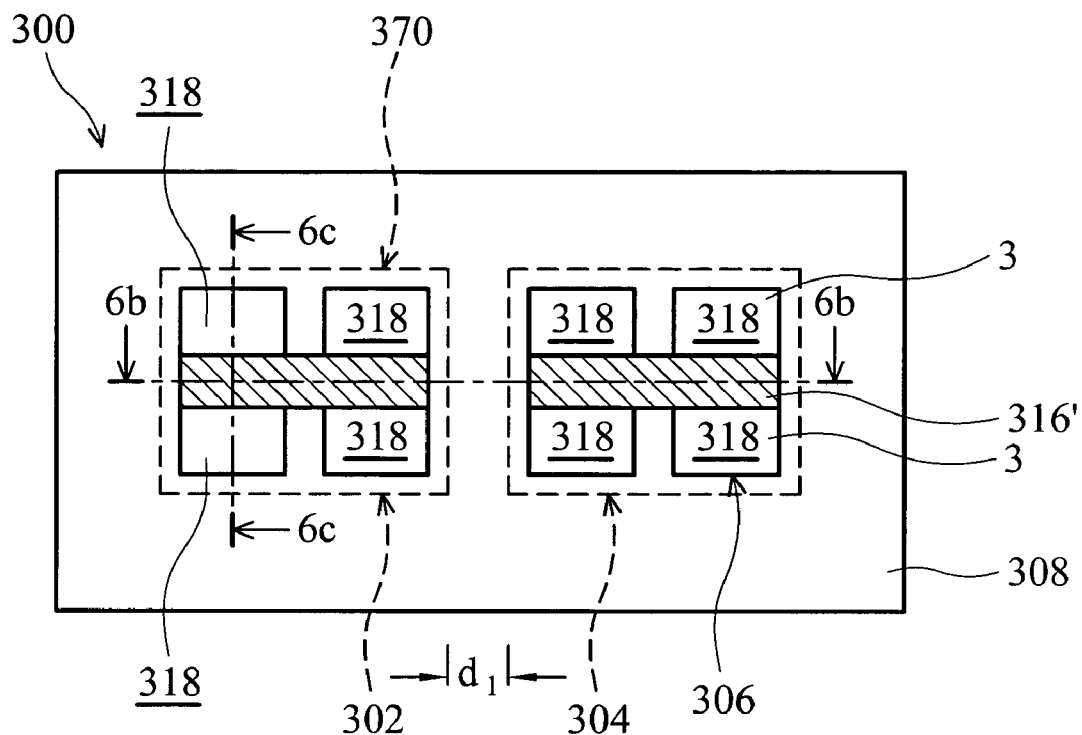
Figure 6B:
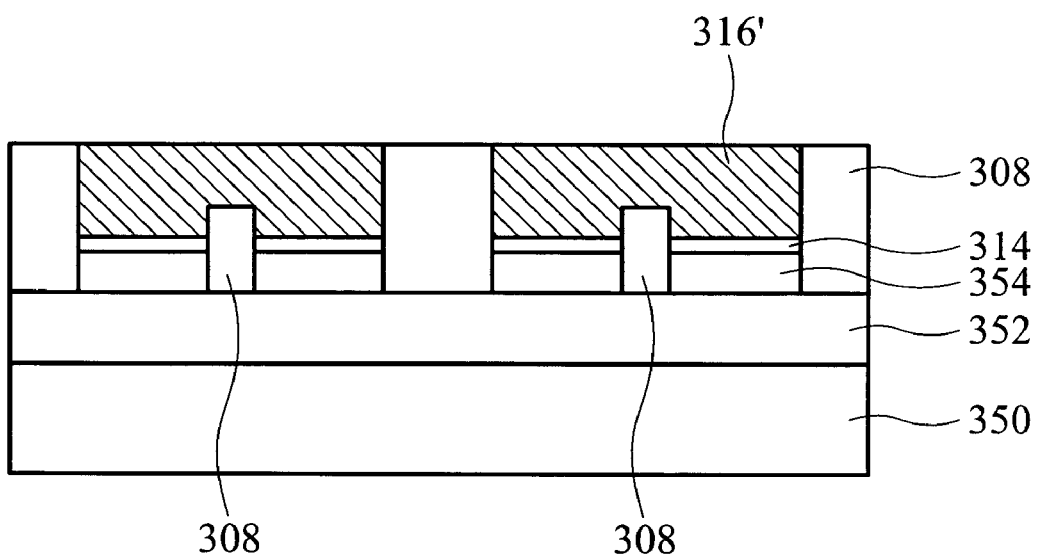
Figure 6C:
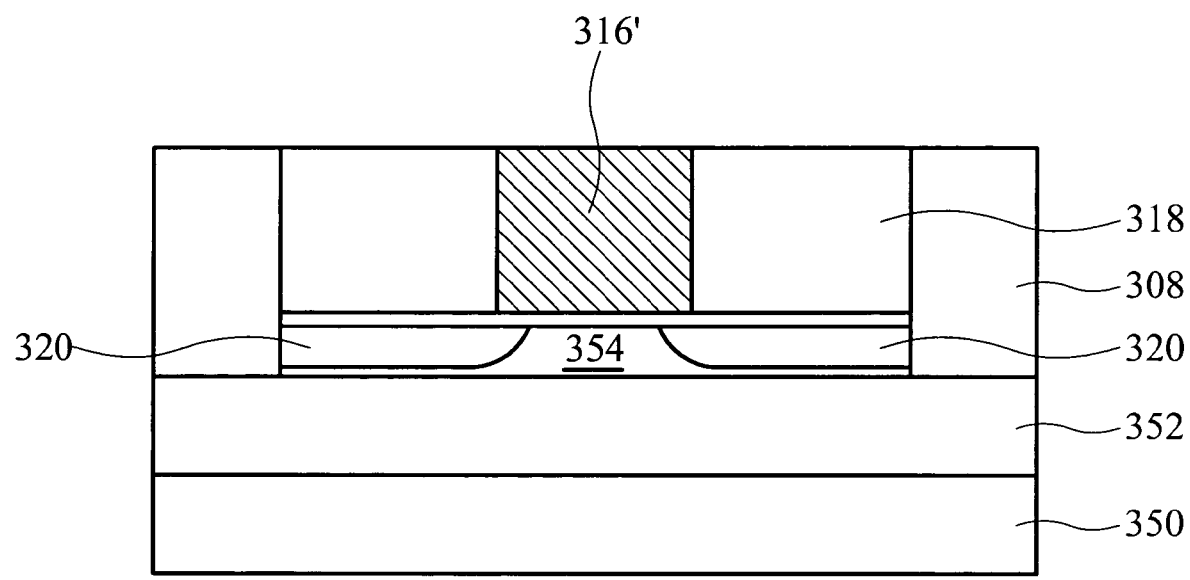

Referring now to the FIG. 6, the conductive layer 316 formed in each of the opening 370 is next patterned to thereby form a word line 316' extending across the opening 370, each covering a portion of the gate dielectric layer 314 in each of the device patterns 306. Next, an ion implantation (not shown) is performed to implant dopants of proper conductivity in the portions of the semiconductor islands 354 exposed by the word line 316', using the word line 316' as implant masks, to thereby form source/drain regions 320 in the portions of the semiconductor islands 354 exposed by the word line 316' (see FIG. 6c). Next, a dielectric material such as boron doped silicon glass (BSG) or boron phosphorous doped silicon glass (BPSG) is blanketly formed over the SOI device 300, covering the insulating layer 308, filling the openings exposed by the word lines 316'. The dielectric material is then planarized by methods such as chemical mechanical polishing (CMP) to thereby leave a passivation layer 318 in each of the openings exposed by the wordlines 316' and leaves a substantially planar surface, thereby forming a transistor over each of the device pattern 306. Sequential circuit or device fabrication steps can be further performed to form an ultimate IC device comprising the SOI device 300 illustrated in FIG. 6, but is not described in detail here, for simplicity. FIGS. 6b and 6c illustrate cross sections taken along line 6b-6b and line 6c-6c of FIG. 6a from different view angle. In FIG. 6, the SOI device 300 is now formed with a pair of transistors formed over each of the device patterns 306 within the device regions 302 and 304. The portion of the word line 316' overlying the semiconductor islands 354 (See FIG. 6b) functions as a word line connecting the transistors with each of the device regions 302 and 304 and portions thereof also function as a gate electrode of the transistors therein. Since the word lines 316' are now embedded within the openings 370 and do not protrude over the surface of the insulating layer 308 adjacent to the openings 370, thus eliminating wordline to wordline short issues associated with the related art. Therefore, a distance d1 between of the adjacent transistors of the device regions 302 and 304 can be reduced and the SOI device 300 can be formed with the device regions 302 and 304 with higher integration.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transistor, comprising:
    a first insulating layer;
    a semiconductor island over a portion of the first insulating layer;
    a gate dielectric layer over a portion of the semiconductor island;
    a gate electrode over the gate dielectric layer;
    a pair of source/drain regions in portions of the semiconductor island opposing the gate electrode; and
    a second insulating layer in direct contact with the first insulating layer, surrounding the gate electrode and having a top surface substantially coplanar with that of the gate electrode, wherein the sidewall of the second insulating layer is adjacent to the sidewall of the semiconductor island and in direct contact with the pair of source/drain regions.

2. The transistor as claimed in claim 1, wherein the gate electrode comprises polysilicon or tungsten.

3. The transistor as claimed in claim 1, wherein the gate dielectric layer comprises silicon oxide, silicon nitride or silicon oxynitride.

4. The transistor as claimed in claim 1, wherein the gate dielectric layer comprises a dielectric material having a dielectric constant greater than 3.0.

5. The transistor as claimed in claim 1, wherein the semiconductor island comprises silicon or silicon germanium.

6. The transistor as claimed in claim 1, wherein the sidewall of the second insulating layer surrounds the sidewall of the semiconductor island.

7. The transistor as claimed in claim 6, wherein the sidewall of the second insulating layer is in direct contact with the sidewall of the semiconductor island.

8. The transistor as claimed in claim 1, wherein the second insulating layer adjacent to the semiconductor island and the second insulating layer in direct contact with the pair of source/drain regions have the same width.

9. The transistor as claimed in claim 1, wherein the semiconductor island has a substantially rectangular profile in cross-sectional view.

\* \* \* \* \*